US 6,737,577 B1

(12) United States Patent
Liao et al.

(10) Patent No.: US 6,737,577 B1
(45) Date of Patent: May 18, 2004

(54) HOUSING OPENING STRUCTURE

(75) Inventors: Wen-Sheng Liao, Taipei (TW); Bo-Wei Chu, Taipei (TW)

(73) Assignee: Tatung Co., LTD, Taipei (TW)

( * ) Notice: Subject to any disclaimer, the term of this patent is extended or adjusted under 35 U.S.C. 154(b) by 0 days.

(21) Appl. No.: 10/457,529

(22) Filed: Jun. 10, 2003

(30) Foreign Application Priority Data

Apr. 4, 2003 (TW) ...................................... 92205353 U

(51) Int. Cl.[7] .................................................. H02G 3/08
(52) U.S. Cl. ............................. 174/50; 174/58; 174/63; 220/4.02; 248/906
(58) Field of Search .............................. 174/50, 58, 63, 174/17 R, 60, 64, DIG. 9; 220/4.02, 3.6, 3.8; 248/906; 439/535

(56) References Cited

U.S. PATENT DOCUMENTS 6,498,293 B2 * 12/2002 Marchand et al. ............ 174/50
6,515,227 B1 * 2/2003 Massey et al. ................ 174/50
6,527,135 B1 * 3/2003 Braun et al. ............... 220/4.02
6,642,446 B2 * 11/2003 Dodds et al. ................. 174/50

* cited by examiner

Primary Examiner—Dhiru R Patel
(74) Attorney, Agent, or Firm—Bacon & Thomas, PLLC

(57) ABSTRACT

A housing opening structure is disclosed, which has a pivoting board pivoted on a housing, a sliding board slidably mounted on the pivoting board, and a top cover fixed on the sliding board. When a technician wants to detach the top cover, due to sliding between the sliding board and the pivoting board, the top cover slides a predetermined distance and rotates to a predetermined angle relative to the housing by the pivoting board, and a stopping member stops a stop section of the pivoting board so that the top cover is stopped instead of falling. When the technician wants to close the top cover, an operating part of the stopping member can be pushed to make the stopping member slide from the back face of the housing to the front face, so the stopping end of the stopping member leaves the stop section of the pivoting board and the pivoting board starts to rotate closed.

6 Claims, 6 Drawing Sheets

US 6,737,577 B1

HOUSING OPENING STRUCTURE

BACKGROUND OF THE INVENTION

1. Field of the Invention

The present invention relates to a housing opening structure and, more particularly, to a case opening structure for a computer device.

2. Description of Related Art

In recent years, a typical computer device, such as a personal computer, has a housing composed of a case and a top cover. A technician wishing to service the computer must open the cover.

However, a prior art top cover is removed by pulling backward on the top cover, or by sliding the top cover forward. Consequently, the entire top cover is separated from the housing. Therefore, a servicing space needed to remove the top cover comprises a fixed space of the housing, and a movement space required for the top cover to be attached or detached, the total of which is a larger working space than the total space of the top cover and the housing. Furthermore, the detachment or attachment process of the prior top cover is a waste of time waste during servicing of the computer device.

SUMMARY OF THE INVENTION

The objective of the present invention is to provide a housing opening structure that can reduce the working space needed for the top cover during the detachment or attachment process.

Another objective of the present invention is to provide a housing opening structure that can reduce overall servicing times.

To achieve these objectives, the housing opening structure of the present invention includes a housing, a pivoting board, a sliding board, a top cover, and at least one stopping member. The housing has a front face, a back face and two opposite side faces. Two first coaxial pivots are disposed on the two side faces, and a first slide structure and a first fastening end are attached to at least one of two side faces. Furthermore, the pivoting board has a front edge, a back edge and at least one second guiding structure extending from the front edge to the back edge. Two curved sections of the pivoting board are each respectively disposed adjacent to two opposite sides of the back edge. Two second coaxial pivots are disposed on the two curved sections and respectively pivoted to the two first coaxial pivots so that the pivoting board is able to rotate relative to the housing, and a stop section is disposed on the curved section corresponding to the side face having the first slide structure and the first fastening end. The sliding board has at least one first guiding structure placed corresponding to at least one second guiding structure, and so is capable of moving a predetermined distance relative to the pivoting board. The top cover is fixed on the sliding board and covers the housing. Moreover, at least one stopping member of the present invention is mounted on the side face having the first slide structure and the first fastening end of the housing, and the stopping member further has a second slide structure, a stopping end, a second fastening end, a spring, and an operating part, wherein the second slide structure slid corresponding with the first slide structure, the spring is fastened on the second fastening end and the first fastening end to apply a predetermine slide force on the stopping member biasing from the front face towards the back face of the housing so as to stop the pivoting board at the stop section with the stopping end of the stopping member, and the operating part is used for pushing the stopping member from the back face to the front face to separate the stopping end from the stop section of the pivoting board.

When a technician wishes detach the top cover, due to a relative sliding motion between the sliding board and the pivoting board, the top cover slides a predetermined distance, and then the top cover is rotated to a predetermined angle by the pivoting board relative to the housing, and the stopping member slides on the housing by the force from the spring to stop the stop section of the pivoting board so that the top cover is stopped instead of falling. The technician can perform a fabrication or maintenance process. When the technician wants to close the top cover, the operating part of the stopping member can be pushed to make the stopping member slide from the back face of the housing to the front face, and so the stopping end of the stopping member leaves the stop section of the pivoting board and the pivoting board starts to rotate closed. The top cover follows the rotation of the pivoting board to close on the housing. Afterward, the technician pushes the top cover to slide and close with the housing by way of the sliding movement of the sliding board relative to the pivoting board.

The opening or detachment process of the top cover utilizes a smaller top space of the housing, and so a working space required for the opening or detachment process of the top cover is reduced. Furthermore, the housing opening structure of the present invention is easy to operate, save time during fabrication or maintenance processes.

Other objectives, advantages, and novel features of the invention will become more apparent from the following detailed description when taken in conjunction with the accompanying drawings.

DETAILED DESCRIPTION OF THE PREFERRED EMBODIMENT

Figure 1:
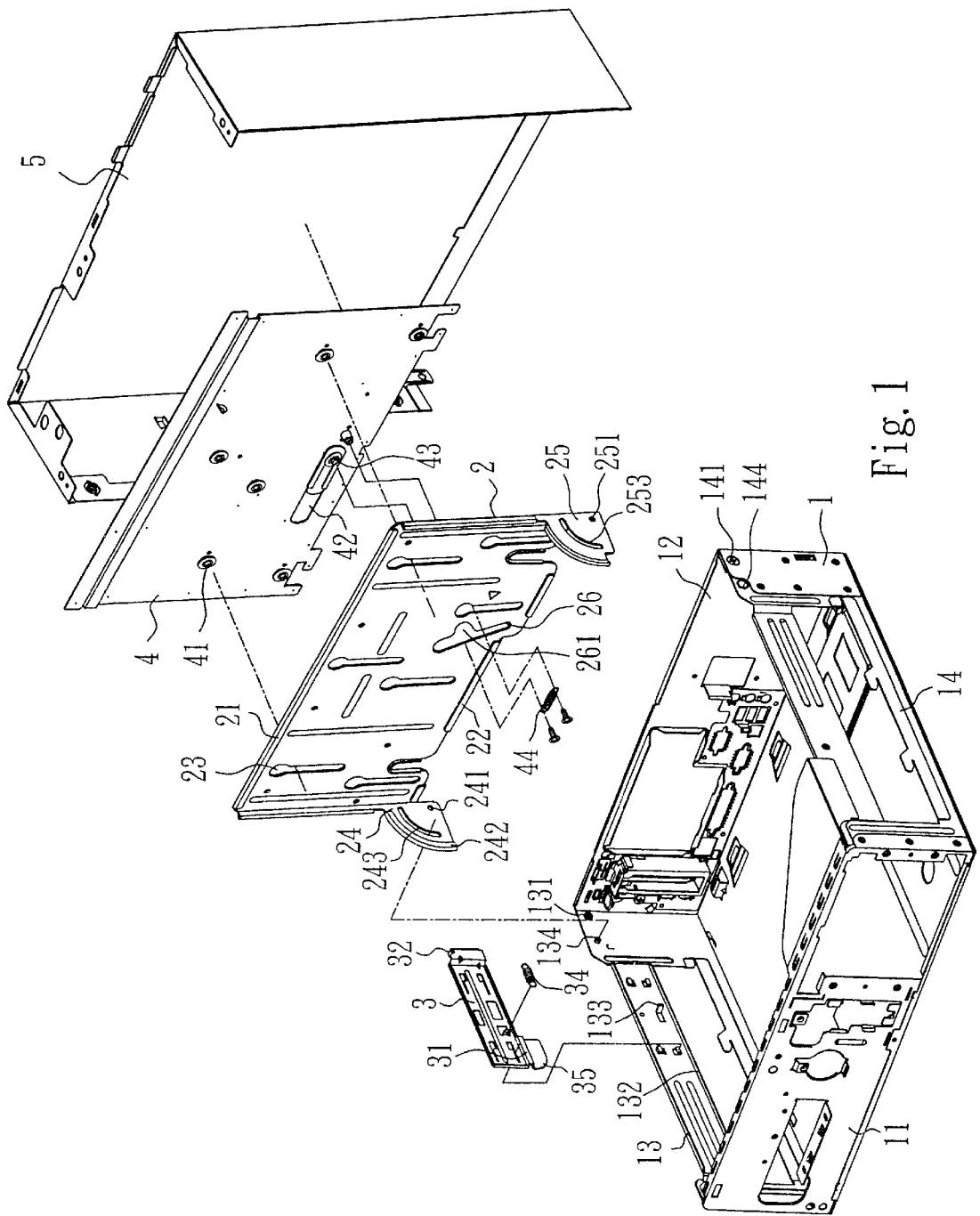
FIG. 1 is an exploded view of the present invention.

Please refer to FIG. 1. FIG. 1 is an exploded view of the present invention. The housing opening structure of the present invention includes a housing 1, a pivoting board 2, a sliding board 4, a top cover 5, and a stopping member 3. The housing 1 has a front face 11, a back face 12 and two opposite side faces 13, 14. Two first coaxial pivots 131, 141 are formed on the two side faces 13, 14, and a first slide structure 132 and a first fastening end 133 are formed on the side face 13. In this embodiment, the two first coaxial pivots 131, 141 are both pivot shafts, and the first slide structure 132 is a guide block.

The pivoting board 2 has a front edge 21, a back edge 22 and seven second guiding structures 23 extending parallel from the region of the front edge 21 towards the region of the back edge 22. In this embodiment, the second guiding structure 23 is a recess. Two curved sections 24, 25 of the pivoting board 2 are respectively disposed adjacent to two opposite sides of the back edge 22. Two second coaxial pivots 241, 251 are respectively formed on the two curved sections 24, 25. In this embodiment, the two second coaxial pivots 241, 251 are both pivot holes, which are disposed in positions that respectively pivoted to the two first coaxial pivots 131, 141 of the housing 1 so that the pivoting board 2 is able to rotate relative to the housing 1. Moreover, a stop section 242 is placed on the curved section 24 of the side face 13 corresponding to the first slide structure 132 and the first fastening end 133. Two guiding recesses 243, 253, which are homocentric with the two coaxial pivots 241, 251, are respectively formed within the two curved sections 24, 25. Two guiding pins 134, 144 are disposed on the side faces 13, 14 of the housing 1 and respectively slot into the two guiding recesses 243, 253. In addition, an oblique slot 26 is formed on the pivoting board 2, obliquely extending from the region of the back edge 22 towards the region of the front edge 21. A stop recess 261 is disposed in the oblique slot 26.

The sliding board 4 has seven first guiding structures 41 disposed in positions respectively corresponding to the second guiding structures 23 and are capable of moving a predetermined distance relative to the pivoting board 2. The first guiding structures 41 are protruding pins. The top cover 5 is fixed on the sliding board 4. The sliding board further comprising a slide slot 42, a wedge 43 and a spring 44, wherein the slide slot 42 disposed on the sliding board 4, the wedge 43 slidably disposed in the slide slot 42 and inserted through the oblique slot 26 of the pivoting board 2.

Figure 4:
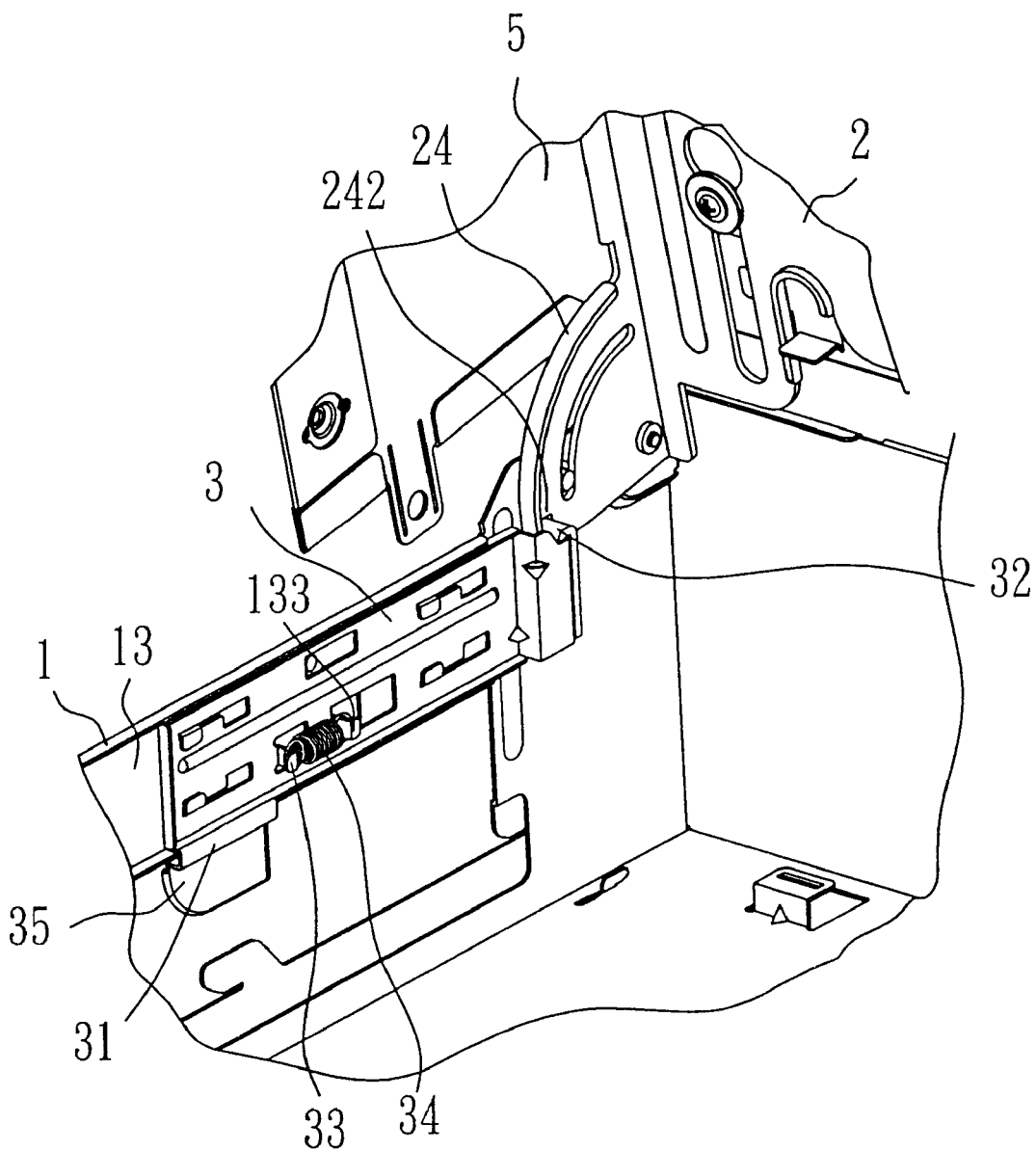
FIG. 4 shows a stopping member performing a stopping function according to the present invention.

Please refer to FIG.1 in conjunction with FIG. 4. FIG. 4 depicts a stopping member performing a stopping function according to the present invention. The housing opening structure of the present invention has one stopping member 3 mounted on the side face 13 by way of the first slide structure 132 and the first fastening end 133 of the housing 1. The stopping member 3 comprises a second slide structure 31, a stopping end 32, a second fastening end 33, a spring 34, and an operating part 35. The second slide structure 31 is a guiding slot corresponding to the first slide structure 132 of the side face 13. The spring 34 is fastened on the second fastening end 33 and the first fastening end 133 to apply a predetermined slide force upon the stopping member 3 biasing from the front face 11 towards the back face 12 of the housing 1.

Figure 2:
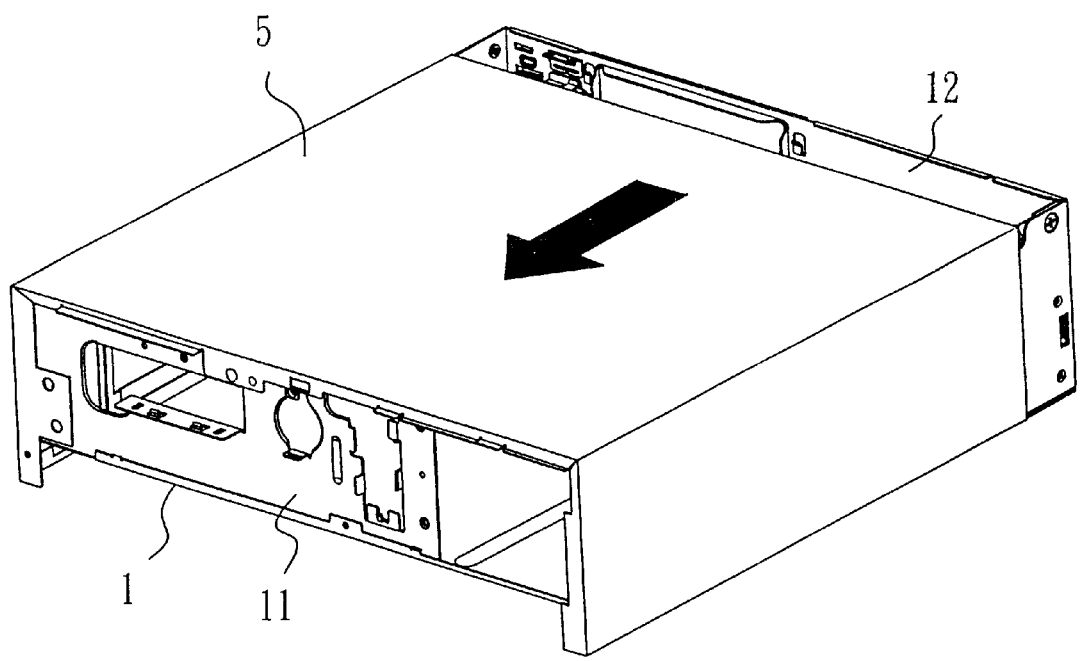
FIG. 2 shows a movement of a top cover according to the present invention.

Please refer to FIG. 1 and FIG. 2. When a technician wants to detach the top cover 5, because of the ability of the first guiding structures 41 of the sliding board 4 to slide within the second guiding structure 23 of the rotating board 2, the top cover 5 slides a predetermined distance toward to the front face 11 of the housing 1. Please refer to FIG. 1, FIG. 3 and FIG. 4. Then the top cover 5 is rotated to a predetermined angle by the pivoting board 2 relative to the housing 1 to avoid striking any other apparatus disposed on the front face 11 of the housing 1, such as a CD drive, and the stopping member 3 slides from the front face 11 of the housing 1 to the back face of the housing 1 by the biasing force from the spring 34 to stop the stop section 242 of the pivoting board 2 by the stopping end 32. At the same time, the pivoting board 2 stops rotating and a spring 44 of the sliding board 4 provides a predetermined force to a wedge 43 that slides into a stop recess 261 of the oblique slot 26, and due to this the top cover 5 and the sliding board 4 stop sliding on the pivoting board 2. In the other words, the top cover 5 is stopped from falling by the wedge 43 and the stop recess 261.

Figure 3:
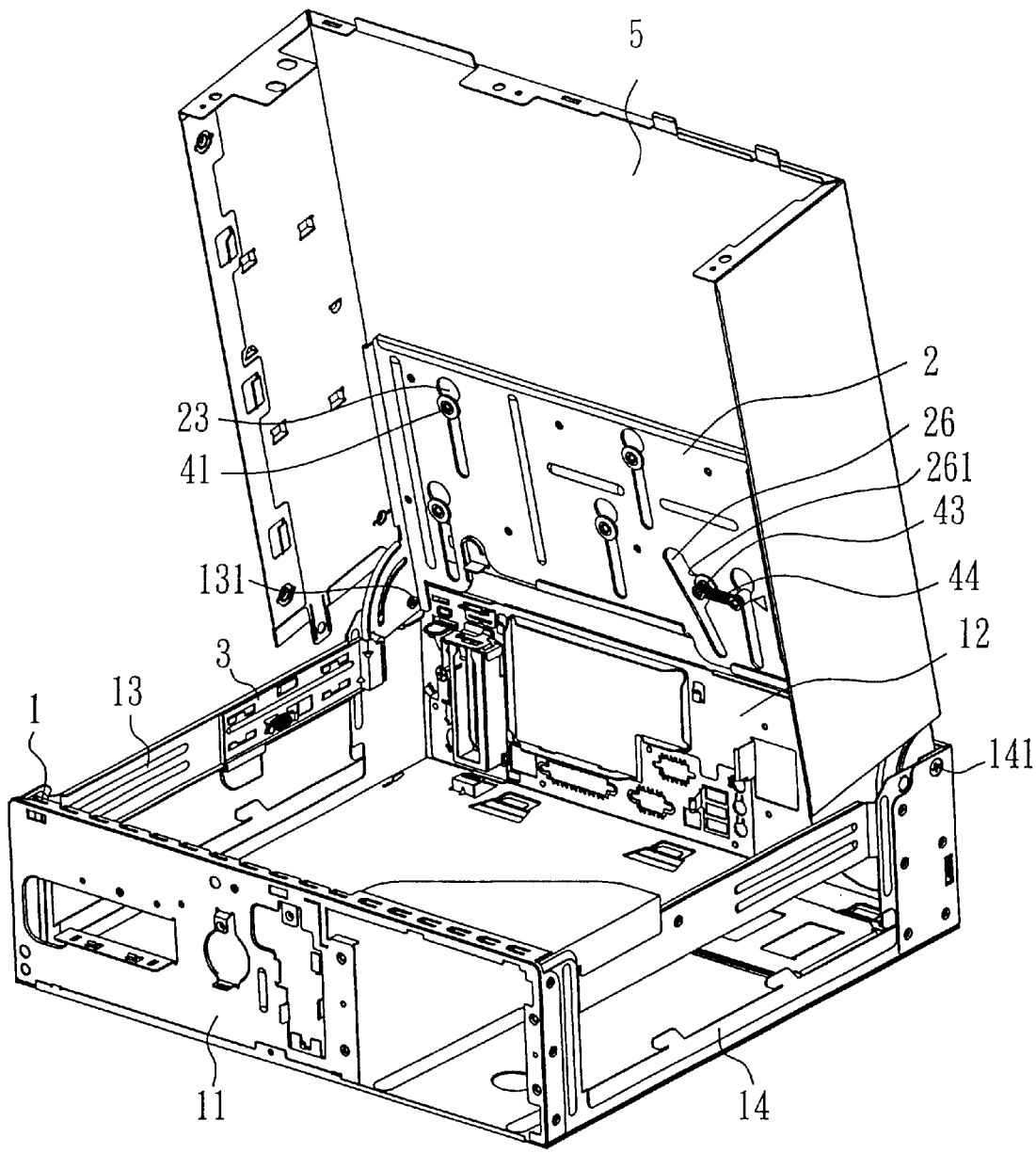
FIG. 3 shows a top cover open according to the present invention.
Figure 5:
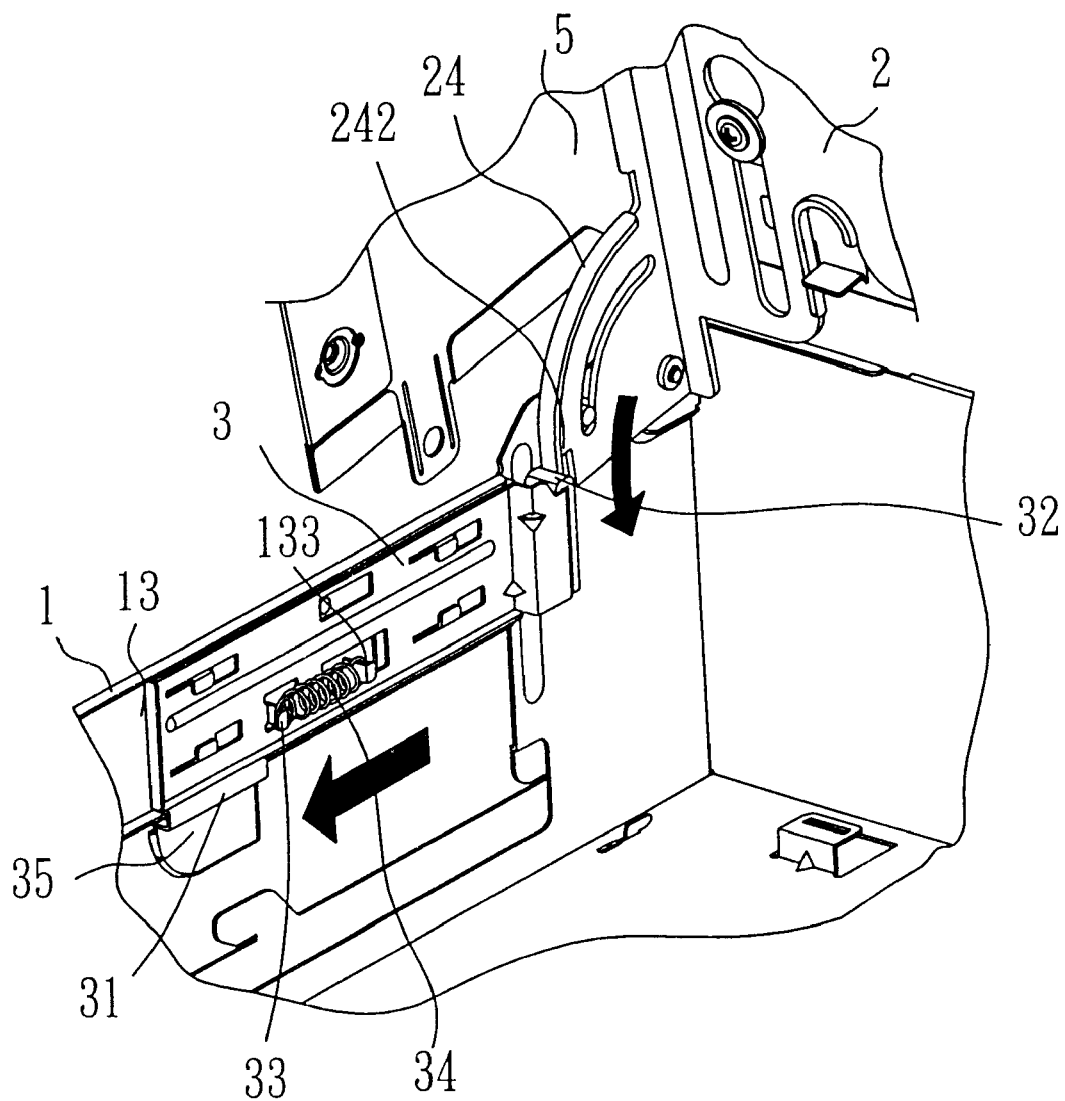
FIG. 5 shows a stopping member in a detached state according to the present invention.
Figure 6:
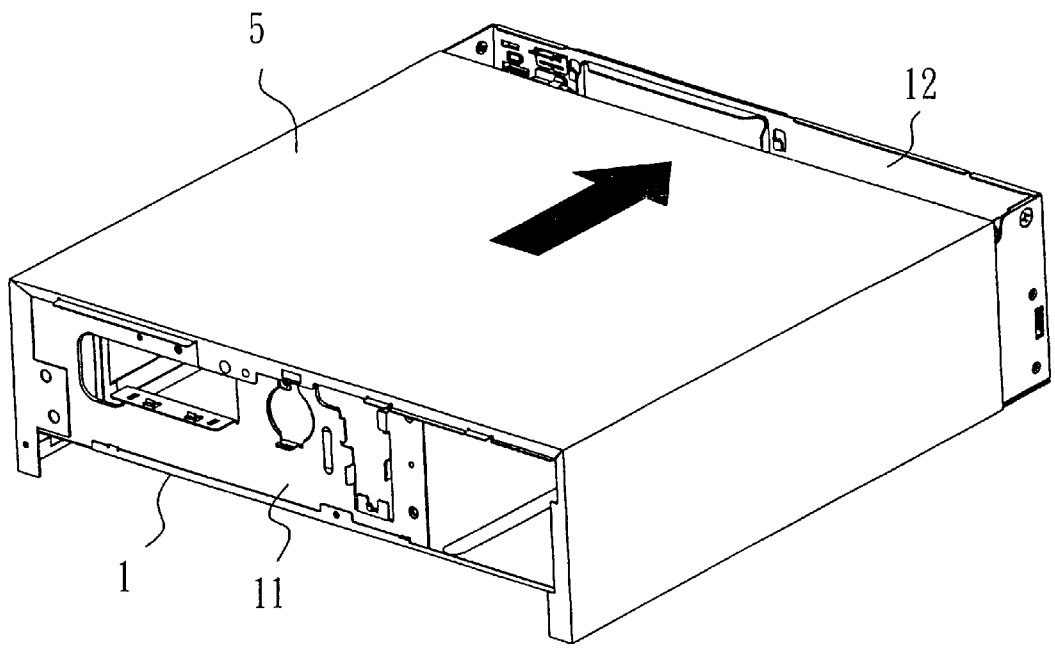
FIG. 6 shows a top cover closed according to the present invention.
Figure 7:
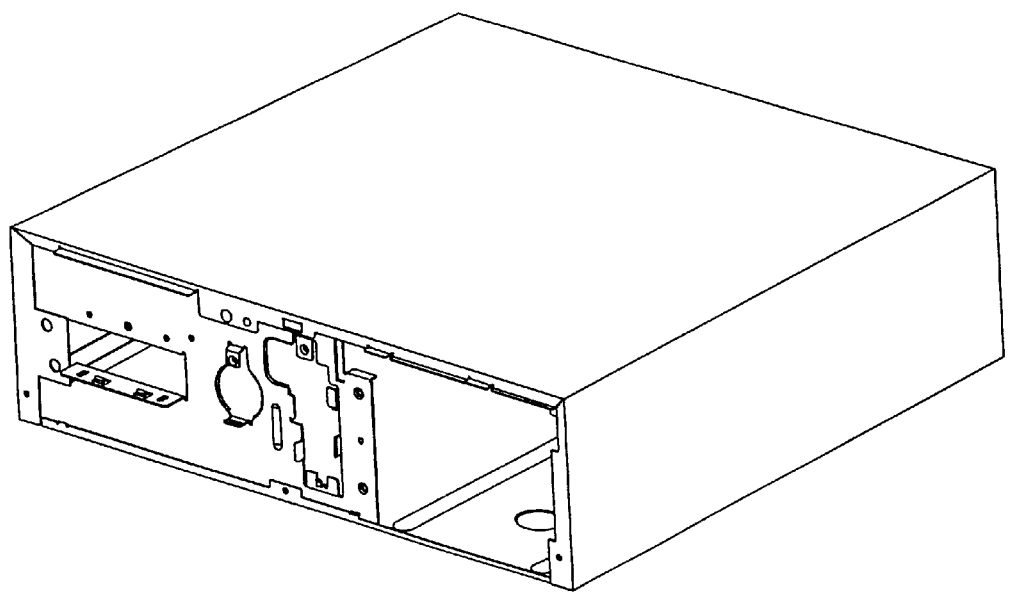
FIG. 7 shows the housing closed according to the present invention.

Please refer to FIG. 3 and FIG. 5. When the technician wants to close the top cover 5, the operating part 35 of the stopping member 3 can be pushed to make the stopping member 3 slide from the back face 12 of the housing 1 to the front face 11, and so the stopping end 32 of the stopping member 3 leaves the stop section 242 of the pivoting board 2, and the pivoting board 2 is able to begin rotating. Please refer to FIG. 5, FIG. 6 and FIG.7. FIG. 5 shows a stopping member in a detached state according to the present invention. FIG. 6 shows the top cover closed according to the present invention. FIG. 7 shows the housing closed according to the present invention. The top cover 5 rotates with the pivoting board 2 to slide and close on the housing 1 due to the sliding movement of the sliding board 4 relative to the pivoting board 2.

The opening or detachment process of the top cover 5 utilizes the top space of the housing 1, and so a working space required for the opening or detachment process of the top cover 5 can be reduced. Furthermore, the housing opening structure of the present invention is easy to operate, and so saves time during maintenance procedures.

It should be noted that the first coaxial pivots 131, 141 and the second coaxial pivots 241, 251 are interchangeable. Similarly, the first slide structure 132 and the second slide structure 31 are interchangeable, as are the first guiding structure 41 and the second guiding structure 23. In addition, the there can be more than just one stopping member 3, meaning that both of the side faces 13, 14 can have a stopping member 3.

The invention has been described using exemplary preferred embodiments. However, for those skilled in this field the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

Although the present invention has been explained in relation to its preferred embodiment, it is to be understood that many other possible modifications and variations can be made without departing from the spirit and scope of the invention as hereinafter claimed.

What is claimed is:

1. A housing opening structure comprising:
   a housing having a front face, a back face and two opposite side faces, two first coaxial pivots being disposed on said two side faces, and a first slide structure and a first fastening end being disposed on at least one of said two side faces;
   a pivoting board having a front edge, a back edge and at least one second guiding structure extending from said front edge to said back edge, two curved sections of said pivoting board respectively being disposed adjacent to two opposite sides of said back edge, two second coaxial pivots being disposed on said two curved sections and respectively pivoted to said two first coaxial pivots so that said pivoting board is capable of rotating relative to said housing, and a stop section disposed on said curved section corresponding to said side face having said first slide structure and said first fastening end;
   a sliding board with at least one first guiding structure disposed corresponding to said at least one second guiding structure and being capable of moving a predetermined distance relative to said pivoting board;

a top cover fixed on said sliding board for covering said housing; and at least one stopping member mounted on the side face having the first slide structure and the first fastening end of said housing, said stopping member comprising a second slide structure, a stopping end, a second fastening end, a spring, and an operating part, wherein said second slide structure slid corresponding with said first slide structure, said spring fastened on said second fastening end and said first fastening end to apply a predetermined slide force on said stopping member biasing from the front face towards the back face of said housing so as to stop said pivoting board at the stop section with said stopping end of said stopping member, said operating part for engaging said stopping member to move from said back face to said front face to separate said stopping end from the stop section of said pivoting board.

2. The housing opening structure as claimed in claim 1 further comprising:

an oblique slot formed on said pivoting board, obliquely extending from a region of said back edge towards a region of said front edge, wherein a stop recess disposed in said oblique slot;

a slide slot disposed on said sliding board; and a wedge slidably disposed in said slide slot and inserted through said oblique slot, wherein a spring provides a predetermined force to said wedge so that when said sliding board moves a predetermined distance relative to said pivoting board, said wedge slides into said stop recess to stop said sliding board.

3. The housing opening structure as claimed in claim 1, wherein said two first coaxial pivots are both pivot shafts, and said two second coaxial pivots are both pivot holes.

4. The housing opening structure as claimed in claim 1, wherein said first slide structure is a guiding block, and said second slide structure is a guiding slot.

5. The housing opening structure as claimed in claim 1, wherein said first guiding structure is a protruding pin, and said second guiding structure is a recess.

6. The housing opening structure as claimed in claim 1, wherein two guiding recesses are respectively homocentric with said two second coaxial pivots and are formed respectively in said two curved sections, and two guiding pins are disposed respectively on the two side faces of said housing and are able to respectively slide in said two guiding recesses.

* * * * *